United States Patent
Nakajima et al.

(10) Patent No.: US 7,279,632 B2
(45) Date of Patent: Oct. 9, 2007

(54) MULTI-ELEMENT POLYCRYSTAL FOR SOLAR CELLS AND METHOD OF MANUFACTURING THE SAME

(75) Inventors: Kazuo Nakajima, Kurokawa-gun (JP); Noritaka Usami, Sendai (JP); Kozo Fujikawa, Sendai (JP); Wugen Pan, Sendai (JP)

(73) Assignee: President of Tohoku University, Sendai (JP)

( * ) Notice: Subject to any disclaimer, the term of this patent is extended or adjusted under 35 U.S.C. 154(b) by 0 days.

(21) Appl. No.: 10/784,932

(22) Filed: Feb. 25, 2004

(65) Prior Publication Data

US 2005/0183766 A1    Aug. 25, 2005

(51) Int. Cl.
*H01L 31/0264* (2006.01)

(52) U.S. Cl. .......................... 136/258; 136/261; 438/97

(58) Field of Classification Search ................ 136/258, 136/261, 262, 252; 257/431; 117/73, 74; 438/97, 93, 487; 423/344, 324
See application file for complete search history.

(56) References Cited

U.S. PATENT DOCUMENTS

| | | | |
|---|---|---|---|
| 5,141,564 A | | 8/1992 | Chen et al. |
| 5,437,734 A | | 8/1995 | Matsushita et al. |
| 2002/0139416 A1* | | 10/2002 | Nakajima et al. ........... 136/258 |

OTHER PUBLICATIONS

Saidov et al, Technical Physics Letters, 27, 2001, pp. 319-322.*
Chan et al, Materials Letters, 14, 1992, pp. 263-267.*

N. Usami, et al., Japan-Australia Workshop on Advanced Materials, Institute for Materials Research (IMR), pp. xiv and 16, "Advanced Si-Based Materials for Solar Cell Applications: Multicrystalline-SiGe With Microscopic Compositional Distribution and Vertically Stacked-Ge Islands", Jan. 15-19, 2004.

N. Usami, et al., Journal of Applied Physics, vol. 94, No. 2, pp. 916-920, "Influence of the Elastic Strain on the Band Structure of Ellipsoidal SiGe Coherently Embedded in the Si Matrix", Jul. 15, 2003.

K. Nakajima, et al., The Fourth International Edition of: Romanian Conference on Advanced Materials, 5 pages, "Melt Growth of SiGe Bulk Crystals With Uniform Composition and SiGe Multicrystals With Microscopic Compositional Distribution for New Si/SiGe Heterostructural Solar Cells", Sep. 15-18, 2003.

(Continued)

*Primary Examiner*—Kaj K. Olsen
(74) *Attorney, Agent, or Firm*—Oblon, Spivak, McClelland, Maier & Neustadt, P.C.

(57) ABSTRACT

Provided is a multi-element polycrystal formed by cooling a melt containing multiple components while controlling a cooling rate. The multi-element polycrystal is a mixed crystal essentially formed of elements Si and Ge having different absorption wavelength ranges and having a composition represented by $Si_{1-X}Ge_X$, in which Ge absorbs light over a longer range of wavelength from a shorter to longer wavelength range than Si, each of the crystal grains of the mixed crystal has a matrix having a plurality of discrete regions dispersed therein, the average matrix composition is represented by $Si_{1-x1}Ge_{x1}$ and the average composition of the discrete regions is represented by $Si_{1-x2}Ge_{x2}$ where X1<X<X2. Also, provided is a solar-cell polycrystal satisfying high light-absorption efficiency and low cost by using the multi-element polycrystal, a solar cell and a method of manufacturing the solar cell.

9 Claims, 10 Drawing Sheets

OTHER PUBLICATIONS

K. Nakajima, et al., Abstract Book, 15th American Conference on Crystal Growth and Epitaxy and 11th Biennial Workshop on OMVPE and 3rd International Symposium on Lasers and Nonlinear Optical Materials, pp. 12, 45 and 46, Jul. 2003.

K. Fujiwara, et al., 3rd World Conference on Photovoltaic Engery Conversion, 5 pages, "Structure and Property of Directionally Grown SiGe Multicrystals With Microscopic Compositional Distribution", May 11-18, 2003.

K. Nakajima, et al., Solar Engergy Materials & Solar Cells, vol. 73, pp. 305-320, "Growth and Properties of SiGe Multicrystals With Microscopic Compositional Distribution for High-Efficiency Solar Cells", 2002.

N. Usami, et al., Journal of Applied Physics, vol. 92, No. 12, pp. 7098-7101, "Strain Distribution of Si Thin Film Grown on Multicrystalline-SiGe With Microscopic Compositional Distribution", Dec. 15, 2002.

N. Usami, et al., Jpn. J. Appl. Phys., vol. 41, part 1, No. 7A, pp. 4462-4465, "Evidence of the Presence of Built-In Strain in Multicrystalline SiGe With Large Compositional Distribution", Jul. 2002.

N. Usami, et al., Jpn. J. Appl. Phys., vol. 41, Part 2, No. 1A/B, pp. L37-L39, "Control of Macroscopic Absorption Coefficient of Multicrystalline SiGe by Microscopic Compositional Distribution", Jan. 15, 2002.

K. Nakajima, et al., Abstract Book, International Forum on Science and Technology of Crystal Growth, 4 pages, "Melt Growth of SiGe Bulk Crystals With Uniform Composition and SiGe Multicrystals With Microscopic Compositional Distrubution for Heterostructure Device Applications", Mar. 4-5, 2002.

K. Nakajima, et al., Abstract Book, Thirteenth American Conference on Crystal Growth and Epitaxy, Sesion 1A, pp. iv, vii and 5, "Growth of SiGe Bulk Crystal With Compositional Uniformity Over 20mm by Controlling the Growth Temperature Utilizing in Situ Monitoring System", Aug. 12-16,2001.

N. Usami, et al., Extended Abstracts of the 20th Electronic Materials Symposium, Nara, pp. 185-186, "Multicrystalline SiGe With Microscopic Compositional Distribution for New Solar Cell Applications", Jun. 20-22, 2001.

K. Nakajima, et al., The European Material Conference, European Materials Research Society, pp. E-2, "Melt Growth of Multicrystalline SiGe With Large Compositional Distribution for New Solar Cell Applications", Jun. 5-8, 2001.

K. Nakajima, et al., pp. 1-64, "Reports on Development of Si/SiGe Solar Cell Using SiGe Multicrystalline Substrate", Mar. 2003 (with partial English translation).

K. Nakajima, et al., pp. 1-32, "Reports on Development of Si/SiGe Solar Cells Using SiGe Multicrystaline Substrate", Mar. 2002 (with partial English translation).

K. Fujiwara, et al., Extended Abstracts (The 50th Spring Meeting), The Japan Society of Applied Physics and Related Societies, No. 1, p. 457, "29a-ZV-3 Crystallographic Orientation Analysis of Directional Grown Si Multicrystals", Mar. 2003.

K. Fujiwara, et al., Extended Abstracts (The 50th Spring Meeting), The Japan Society of Applied Physics and Related Societies, No. 1, p. 458, "29a-ZV-5 Crystallographic Orientation Analysis and Absorption Coefficient Measurement of Directional Grown SiGe Multicrystals With Microscopic Compositional Distribution" Mar. 2003 and "29a-ZV-6 Elastic Strain in Ellipsoidal SiGe Inclusion Coherently Embedded in Si Matrix and its Impact on the Band Structure", Mar. 2003.

T. Ujihara, et al., Extended Abstracts (The 63th Autumn Meeting) The Japan Society of Applied Physics, No. 2, p. 783, "26p-G-4 Effect of Growth Temperature on the Morphology of Epitaxial Silicon Film on Si(111) by LPE Method", Sep. 2002.

K. Nakajima, et al., p. 57, Abstract of Lecture Meeting, The Japan Society of Metal, "$S_1$ 22", Mar. 28-30, 2002.

K. Nakajima, et al., pp. 284, Abstract of Lecture Meeting, The Japan Society of Metal, "ABSTRACT 414", Mar. 28, 2002.

K. Nakajima, et al., 2 pages, The 169th Forum on Material Science, Nov. 26, 2001.

K. Nakajima, et al., pp. 104-107, Workshop on High Efficiency Solar Cell and Photovoltaic Generation, Nov. 15, 2001.

K. Nakajima, et al., p. 161, Abstract of Lecture Meeting of The Japanese Society of Metal, "ABSTRACT $S_8$ . 17", Sep. 22-24, 2001.

K. Nakajima, et al., p. 476, Abstract of Lecture Meeting of the Japanese Society of Metal, "ABSTRACT 848", Sep. 22-24, 2001.

N. Usami, et al., Extended Abstracts (The 62th Autumn Meeting), The Japan Society of Applied Physics, No. 1, pp. 302, 368 and 458, "12a—S—11 Control of Macroscopic Properties of Multicrystalline-SiGe by Microscopic Compositional Distribution" and "26a-P11-3 Characterization of Multicrystalline SiGe With Microscopic Compositional Distribution Using μ-Raman Spectroscopy", Sep. 11, 2001.

K. Nakajima, et al., Extended Abstracts (The 48th Spring Meeting), The Japan Society of Applied Physics and Related Societies, No. 1, pp. 452, "Melt Growht of Multicrystalline SiGe With Large Compositional Distribution for New Solar Cell Applications", Mar. 28-31, 2001.

N. Nakajima, et al., Crystal Letters, No. 18, pp. 3-14, Dec. 2001 (with English Abstract).

P. Geiger, et al., "Multicrystalline SiGe Solar cells wtih Ge content above 10 at%", Proceedings of 16th European photovoltaic Solar Energy Conference, May 1-5, 2000, Glasgow, UK., Edited by H. Scheer et. al., James & James, London, vol. 1, pp. 150-153.

Kazuo Nakajima, et al., "Growth of Ge-rich, $Si_x Ge_{1-x}$ single crystal with uniform composition (x=0.02) on a compositionally graded crystal for use as GaAs solar cells", Journal of Crystal Growth, vol. 205, No. 3, Aug. 1999, pp. 270-276.

Kazuo Nakajima, et al., "Bridgmen growth of compositionally graded $In_x Ga_{1-x} As$ (x=0.05-0.30) single crystals for use as seeds for $In_{0.25} Ga_{0.75} As$ crystal growth", Journal of Crystal growth, vol. 173, No. 1-2, Mar. 1997, pp. 42-50.

J. G. Werthen, et al., "Recent Advances in High-Efficiency InGaAs Concentrator Cells", Conference Record of the Twentieth IEEE Photovoltaic Specialists Conference, vol. 1, Sep. 1988, pp. 640-643.

* cited by examiner

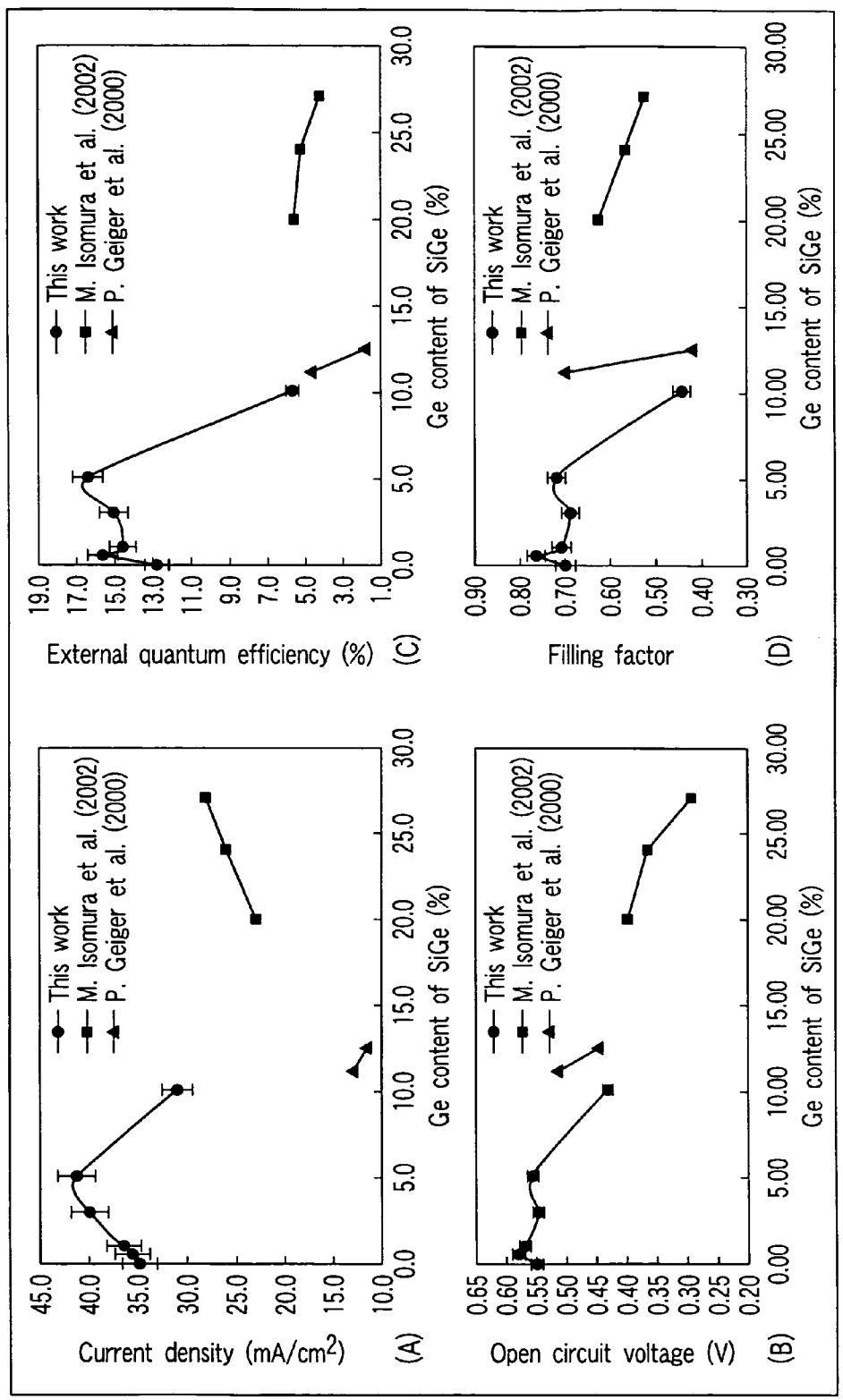
F I G. 4

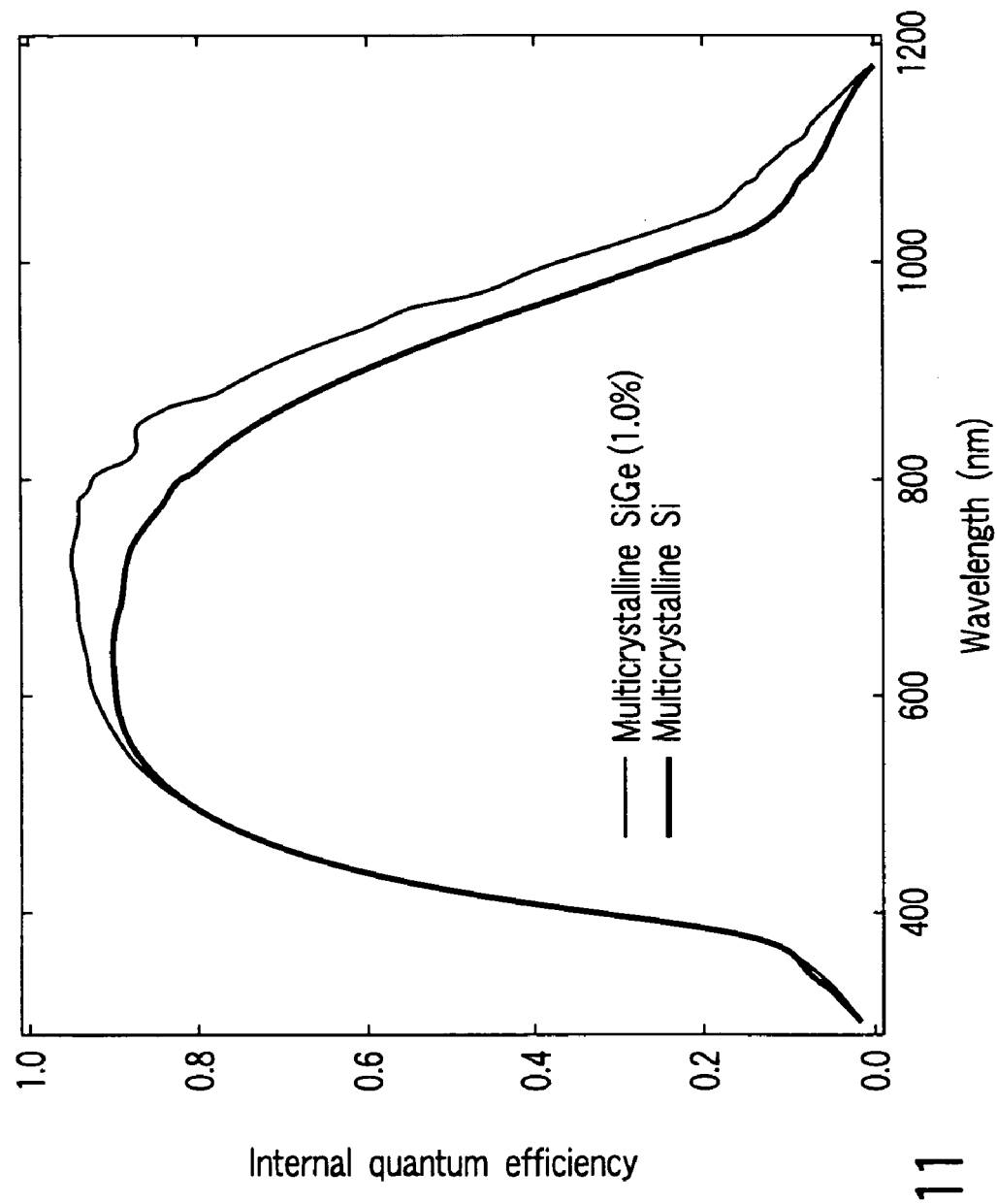
F I G. 11

MULTI-ELEMENT POLYCRYSTAL FOR SOLAR CELLS AND METHOD OF MANUFACTURING THE SAME

BACKGROUND OF THE INVENTION

1. Field of the Invention

The present invention relates to a polycrystal for use in a solar cell, formed of a plurality of elements such as SiGe or InGaAs, and a method of manufacturing the same.

2. Description of the Related Art

As a method for manufacturing a polycrystal for use in a practical solar cell at low cost, a cast method (a kind of solidification method) is known. Although an Si polycrystal can be formed at low cost by the cast method, the Si polycrystal cannot absorb sunlight in a long-wavelength range of the solar spectrum. Due to this, the light conversion efficiency of the Si polycrystal is low. On the other hand, as a high efficiency solar cell, a tandem-form solar cell is known. The tandem-form solar cell has a hetero-structure having a thin-film compound-semiconductor stacked on a Ge or Si. However, the tandem-form solar cell has a problem in cost. Since it is formed by epitaxial growth, the cost is high.

As described above, a polycrystal for a solar cell providing high light-absorption efficiency at low cost has not yet been obtained. In fact, an appropriate polycrystal presently developed is chosen depending upon the use of the solar cell and put in use at present. However, recently, to use sunlight as a clean energy source more and more, the technique for developing a solar cell having a high conversion efficiency at low cost has been strongly desired.

BRIEF SUMMARY OF THE INVENTION

An object of the present invention is to provide a polycrystal for a solar cell capable of efficiently absorbing sunlight at low cost, a method of forming the polycrystal, and a solar cell obtained by this method.

To attain the object, the present invention has the following features.

1. A multi-element polycrystal, which is a mixed crystal essentially formed of elements A and B having different absorption wavelength ranges and having an average composition represented by $A_{1-x}B_x$, in which the element B absorbs light over a longer range of wavelength from a shorter to longer wavelength range than the element A;

each of the crystal grains of the mixed crystal has a crystallographic texture composed of a plurality of discrete regions dispersed in a matrix thereof; and the average composition of the matrix is represented by $A_{1-x1}B_{x1}$ and the average composition of the discrete regions is represented by $A_{1-x2}B_{x2}$ where X1<X<X2.

2. The multi-element polycrystal according to item 1, in which the $A_{1-x}B_x$ is $Si_{1-x}Ge_x$.

3. The multi-element polycrystal according to item 2, in which the X satisfies the relationship: $X \leq 0.1$.

4. The multi-element polycrystal according to item 2, in which the crystal grains each have a columnar shape, and the discrete regions are three-dimensionally dispersed in the matrix having strain.

5. The multi-element polycrystal according to item 1, which is used in a solar cell.

6. A multi-element polycrystal, which is a mixed crystal essentially formed of elements C, D, and E having different absorption wavelength ranges and having an average composition represented by $C_{1-x}D_xE$, in which each of the crystal grains of the mixed crystal has a crystallographic texture having a plurality of discrete regions dispersed in a matrix thereof; and the average composition of the matrix is represented by $C_{1-x1}D_{x1}E$ and the average composition of the discrete regions is represented by $C_{1-x2}D_{x2}E$, where X1<X<X2

7. The multi-element polycrystal according to item 6, wherein the $C_{1-x}D_xE$ is $Ga_{1-x}In_xAs$.

8. The multi-element polycrystal according to item 6, which is used in a solar cell.

9. A method of manufacturing a multi-element polycrystal having polycrystalline grains each being formed of a crystallographic texture having discrete regions dispersed in a matrix, comprising the steps of:

preparing a melt containing multi elements; and cooling the melt while controlling a cooling rate and/or a composition of the melt to obtain a multi-element polycrystal.

10. The method according to item 9, in which the melt has a composition for a mixed crystal represented by $A_{1-x}B_x$; the element B absorbs light over a longer range of wavelength from a shorter to longer wavelength range than the element A; each of the polycrystal grains manufactured has a crystallographic texture in which a plurality of discrete regions having an average composition represented by $A_{1-x2}B_{x2}$ are dispersed in a matrix thereof having an average composition represented by $A_{1-x}B_x$ where X1<X<X2.

11. The method according to item 10, in which the element A is Si and the element B is Ge.

12. The method according to item 10, in which the X satisfies the relationship: $X \leq 0.1$.

13. The method according to item 9, in which the melt has components of a mixed crystal represented by $C_{1-x}D_xE$, each of the polycrystal grains manufactured has a plurality of discrete regions dispersed in a matrix thereof; and the average composition of the matrix is represented by $C_{1-x1}D_{x1}E$ and the average composition of the discrete regions is represented by $C_{1-x2}D_{x2}E$, where X1<X<X2.

14. The method according to item 9, wherein the elements C, D and E are respectively Ga, In and As.

15. A method of manufacturing a solar cell by using a multi-element polycrystal manufactured by the method according to item 9.

In the present invention, an average Ge concentration in the SiGe polycrystal is preferably 5 atomic % or less; however, the Ge concentration of the Ge-rich region is preferably 50 atomic % or more.

The present invention is summarized as follows.

The light conversion efficiency of a solar cell can be increased if the solar cell can absorb light over a long range of wavelength, which is the same wavelength range as a solar spectrum has, and convert it to electric energy.

However, an Si polycrystal has a problem in that it absorbs light of a short wavelength and does not absorb that of a long wavelength. Therefore, a solar cell using the Si polycrystal has a low light-conversion efficiency.

In contrast, Ge can absorb light of a long wavelength range. Therefore, if Si is used in combination with Ge, in other words, if an SiGe polycrystal is used, it is possible to absorb light over a long range of wavelength, which has the same wavelength as a solar light, and convert it to electric energy. To attain this, it has been considered that the Ge content of an SiGe polycrystal must be increased.

However, large content of Ge in the SiGe polycrystal produces problems: the (short circuit) current density does not increase so much and the open circuit voltage significantly decreases. Such drawbacks of Ge cancel out the advantages of an SiGe crystal of absorbing light over a long wavelength range. This dilemma has not hitherto been overcome.

The present invention is characterized in that the light absorption range by a polycrystal can be extended to a longer wavelength range by dispersing Ge-rich regions in the matrix of the polycrystal even though the entire content of Ge is not increased. Since the entire Ge content is not increased, the SiGe polycrystal of the present invention has overcome the problems: little increase of the current density and significant decrease in open circuit voltage.

As described, the technique of the present invention that a plurality of discrete regions are dispersed in a matrix may be applied to a process for forming other multi-element polycrystals to be used in solar cells, other than an SiGe system. For example, in the case of an InGaAs system, the object of the present invention is attained by dispersing a plurality of In-rich regions in an In-rich matrix rich of each crystal grain thereof.

According to the present invention, it is possible to form, for example, a SiGe polycrystal composed of crystal grains each having a crystallographic texture in which Ge-rich discrete regions are dispersed in the Si-rich matrix, by controlling cooling conditions, such as a cooling rate and a super cooling rate, and a melt composition by use of a method for growing a crystal from a melt. The crystallographic texture is capable of absorbing solar light very efficiency and has light-sensitive-elements desirably dispersed therein. According to the present invention, such light sensitive element regions are successfully dispersed in the matrix by a practical and simple method, such as a cast method, thereby manufacturing a polycrystal for a high-efficient solar cell and a solar cell employing the polycrystal. This method is very practical method for manufacturing a multi-element polycrystal having a structure for absorbing light with a high efficiency, without using a complicated structure such as a tandem structure; and can be applied to manufacturing a multi-element crystal such as InGaAs.

BRIEF DESCRIPTION OF THE DRAWING

FIG. 4 is graphs (A) to (D) showing the dependency of solar-cell characteristics upon Ge content with respect to the solar cell of the present invention and conventional ones described in Documents 1 and 2;

FIG. 11 shows the relationship between internal quantum efficiency and wavelength with respect to a multi-element polycrystalline Si and SiGe.

DESCRIPTION OF THE PREFERRED EMBODIMENTS

Figure 1:
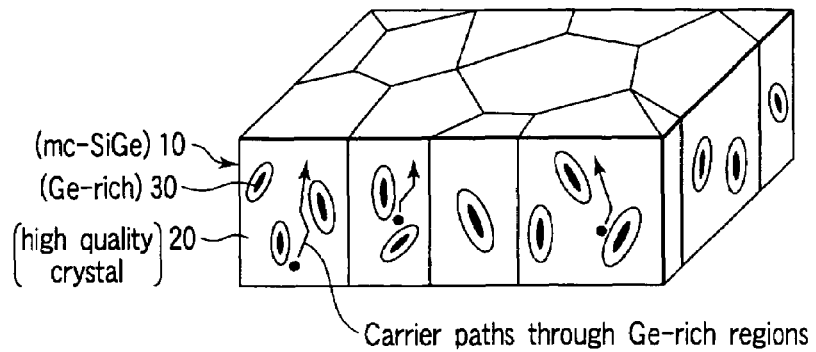
FIG. 1 is a schematic view of an SiGe polycrystal grain (SiGe bulk) in which numerous discrete regions are dispersed in the matrix thereof.

FIG. 1 is a schematic view of an SiGe polycrystal grain (generally having a diameter of several microns to several millimeter) in which numerous discrete regions are dispersed in the matrix thereof. The composition of a crystal grain 10 is represented by $Si_{1-x}Ge_x$. However, the matrix 20 is rich in Si, whereas the discrete region is rich in Ge.

Figure 2:
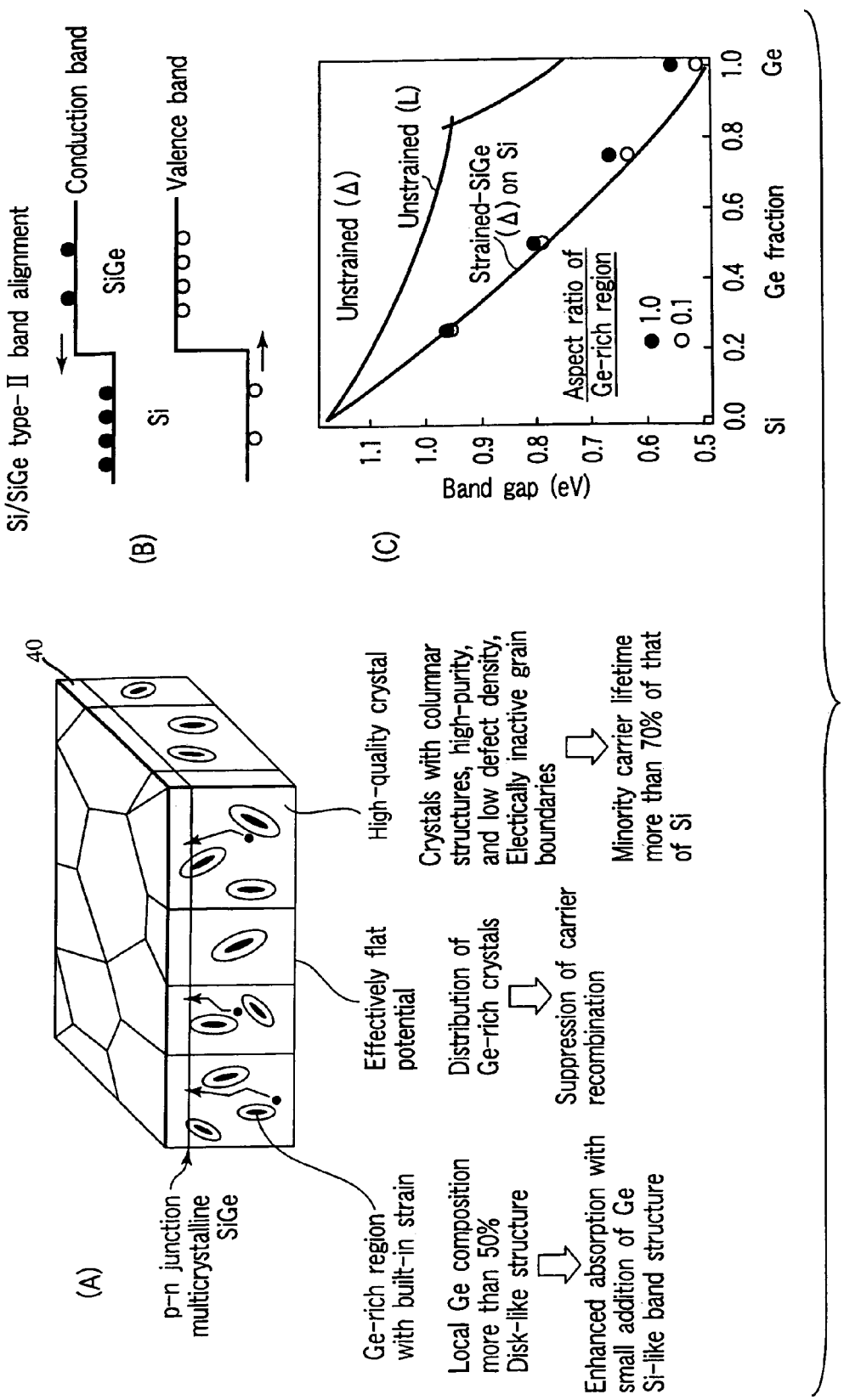
FIG. 2 is schematic illustrations (A) to (C) showing a crystal grain of a multi-element SiGe polycrystal having discrete regions microscopically dispersed in the matrix, Si/SiGe type-II band alignment, and band gap of SiGe.

The reference symbol X in $Si_{1-x}Ge_x$ is preferably 0.1 or less ($X \leq 0.1$). Furthermore, each crystal grain desirably has a columnar structure and preferably has a high-purity, few defects and an electrically inactive interface. The Ge-rich discrete regions 30 each have a planar structure are three-dimensionally dispersed in a crystal grain. FIG. 2(A) shows a solar cell formed of the polycrystal thus constructed. This figure shows a schematic illustration of an Si/SiGe heterostructure solar cell with Si thin film 40 epitaxially grown on a multi-element polycrystalline SiGe.

The solar cell having such a structure may have the following mechanism.

The SiGe polycrystal has numerous Ge-rich regions dispersed in the Si-rich matrix. The light-absorption efficiency of such a SiGe polycrystal in a long-wavelength region is enhanced by adding a small amount of Ge in the crystal. The solar cell obtained in this manner must have a good quality. This is because carrier paths are produced through Ge-rich regions, so that carriers (electrons) may be prevented from recombining to each other in the Ge rich regions. The Si/SiGe heterostructure has a band structure of type II (see FIG. 2(B)), so that electrons can easily move from the SiGe crystal to the Si thin layer through a hetero-junction (p-n junction). The band-gap voltage decreases by the strain produced in the Ge-rich regions. Therefore, a large amount of Ge is not required to be added to the crystal in order to improve the light absorption efficiency in the longer wavelength range (see FIG. 2(C)).

Figure 3:
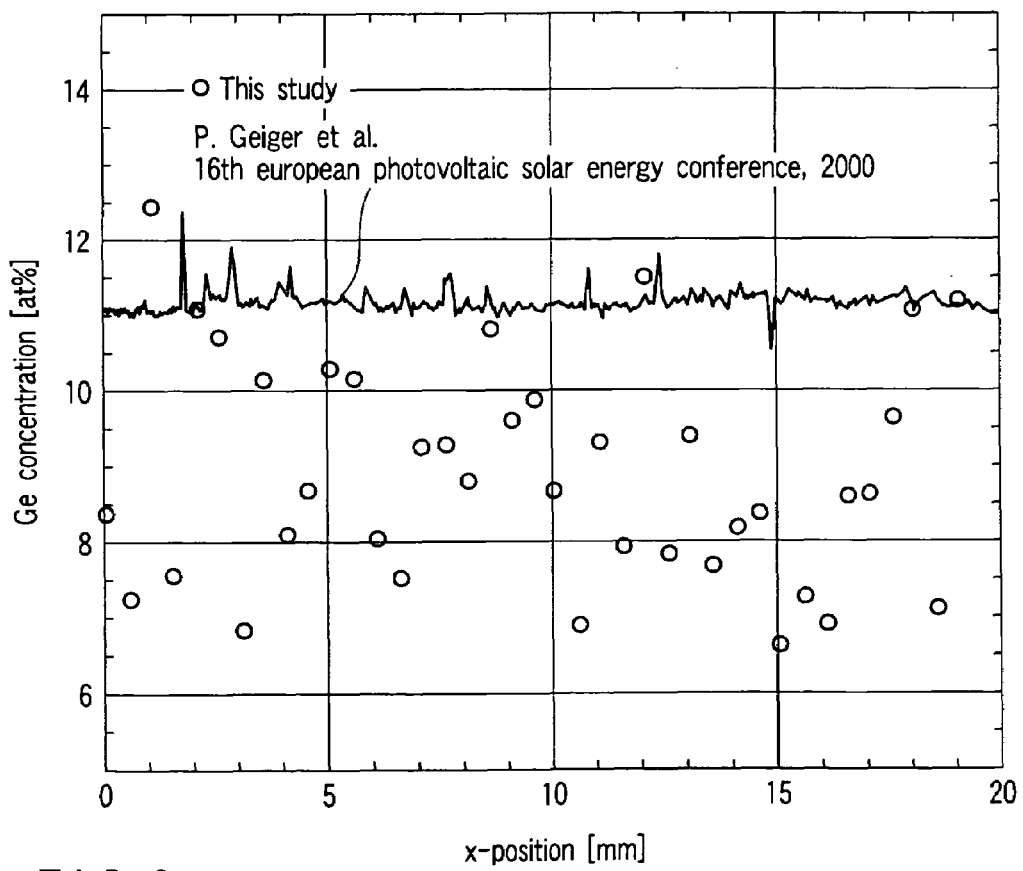
FIG. 3 is a graph showing the Ge contents of individual sampling points within a crystal grain with respect to the solar cell SiGe bulk polycrystal of the present invention and a conventional SiGe bulk polycrystal (described in Document 1)

Furthermore, in the present invention, when a value, X, of the formula of a crystal grain is determined by measuring the composition at any given point within the crystal grain, it was found that the value X varies in a wide range of 0 to 1. The measurement results are shown in the graph of FIG. 3 in comparison with that of conventional document 1 (P. Geiger, et al., "multicrystalline SiGe Solar cells with a Ge content of above 10%", Proceedings of 16th European Photovoltaic Solar Energy Conference, 1-5, May 2000, Glasgow, UK, Edited by H. Scheer et al., JAMES & JAMES, London, Vol. 1, pp. 150-153). Document 1 describes an SiGe bulk polycrystal for a solar cell having an average Ge content of 10 atomic %.

However, the polycrystal disclosed in Document 1 has a uniform composition. More specifically, in the SiGe polycrystal disclosed in Document 1, it is found, from the figure shown in Document 1, that the microscopic compositions of any given points of a crystal grain vary only within the range of ±2% or less. Even if any SiGe polycrystal tried to be formed uniformly, such a variance (±2% or less) in composition inevitably entails. However, a crystal having such a variance in composition is not equivalent to a crystal grain of the present invention having numerous discrete regions dispersed in the matrix.

FIG. 3 is a graph showing the Ge contents of individual sampling points within a crystal grain with respect to the solar cell SiGe bulk polycrystal of the present invention and a conventional one (described in Document 1). As is apparent from FIG. 3, the microscopic Ge contents of the SiGe bulk polycrystal for a solar cell according to the present invention varies from site to site in a broader concentration range than that of Document 1. It is therefore found that the composition of the SiGe bulk polycrystal of Document 1 differs from that of the present invention.

The Ge concentrations, volumes, amounts and distribution of the discrete regions within a crystal grain are not simply determined because they differ depending upon the types of raw materials, desired characteristics, and use thereof. Conversely to say, the characteristics of the discrete region can be appropriately determined by those skilled in the art.

The microscopic distribution of the Ge contents of the discrete regions of a polycrystal grain can be designed such that the polycrystal grain can absorb solar light efficiently to convert the solar light into energy as efficient as possible.

The crystal having a microscopically nonuniform composition can be obtained by "controlling the cooling rate of a crystal gain". A preferable cooling rate cannot be simply determined because a desired Ge distribution within a polycrystal differs depending upon the raw materials to be employed, requisite characteristics, and uses thereof.

FIGS. 4(A) to (D) are graphs showing the dependency of solar-cell characteristics upon Ge content with respect to the solar cell of the present invention and conventional ones described in Documents 1 and 2.

FIG. 4(A) shows the dependency of current density upon Ge content; FIG. 4(B), the dependency of open circuit voltage upon Ge content; FIG. 4(D), the dependency of filing factor upon Ge content; and FIG. 4(C), the dependency of external quantum efficiency upon Ge content.

The SiGe polycrystal of the present invention is indicated by a red circle; the SiGe polycrystal of Document 1 (P. Geiger et al.) by a black triangle; and the SiGe polycrystal of Document 2 (M. Isomura et al.) by a blue square.

As is apparent from FIG. 4, the SiGe polycrystals of Documents 1 and 2 contain Ge in an amount of 10 atomic % or more. This is because those skilled in the art believed that a desired conversion efficiency of a solar cell cannot be improved unless Ge is contained in a large amount before the present application was filed. However, in the solar cell formed of a SiGe bulk polycrystal according to the present invention, a small amount of Ge can be efficiently used by dispersing Ge-rich regions in the matrix. As is apparent from FIG. 4(A), the increase of a short-circuit current density (external quantum efficiency) of the SiGe polycrystals of Document 1 and 2 is low. In addition, the open circuit voltage greatly decreases with an increase of the Ge content. As a result, the conventional solar cells have conversion efficiencies of only about 6%. In contrast, the present invention can provide a conversion rate as large as 17%.

FIGS. 5(A) and 5(B) show the characteristics of a conventional solar cell using Si bulk polycrystal. The Si bulk polycrystal is manufactured in the same conditions as in the SiGe bulk polycrystal shown in FIG. 6.

FIGS. 6(A) and 6(B) are graphs showing the characteristics of a solar cell of the present invention using an SiGe bulk polycrystal, in which Ge-rich regions are dispersed in an Si-rich matrix of a crystal grain, an average Ge content is 5%.

FIGS. 5(A) and 6(A) show the dependency of current density upon voltage and FIGS. 5(B) and 6(B) shows the dependency of external quantum efficiency upon wavelength.

Figure 5:
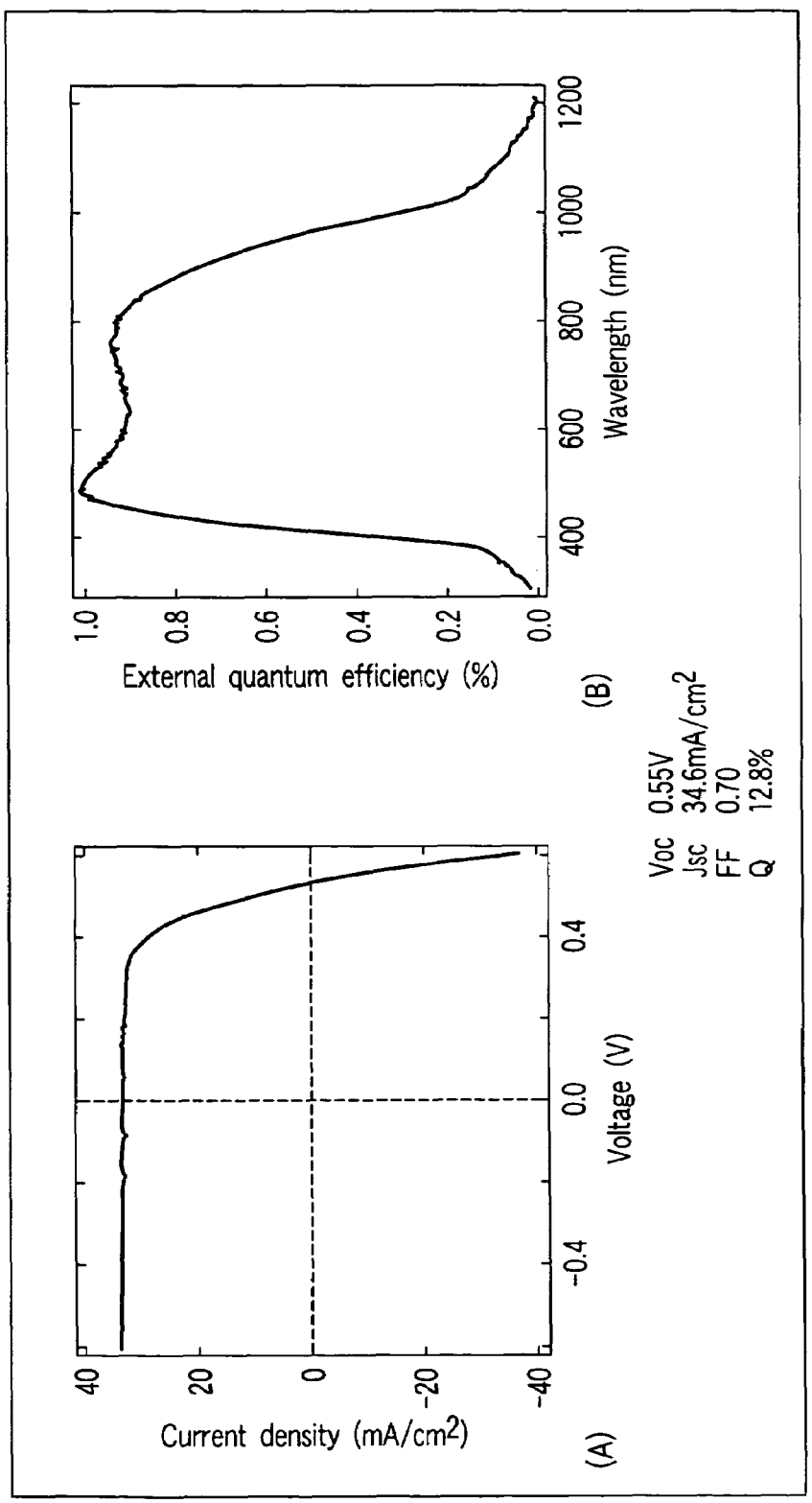
FIG. 5 is graphs (A) and (B) showing the performance of a solar cell using an Si bulk polycrystal.
Figure 6:
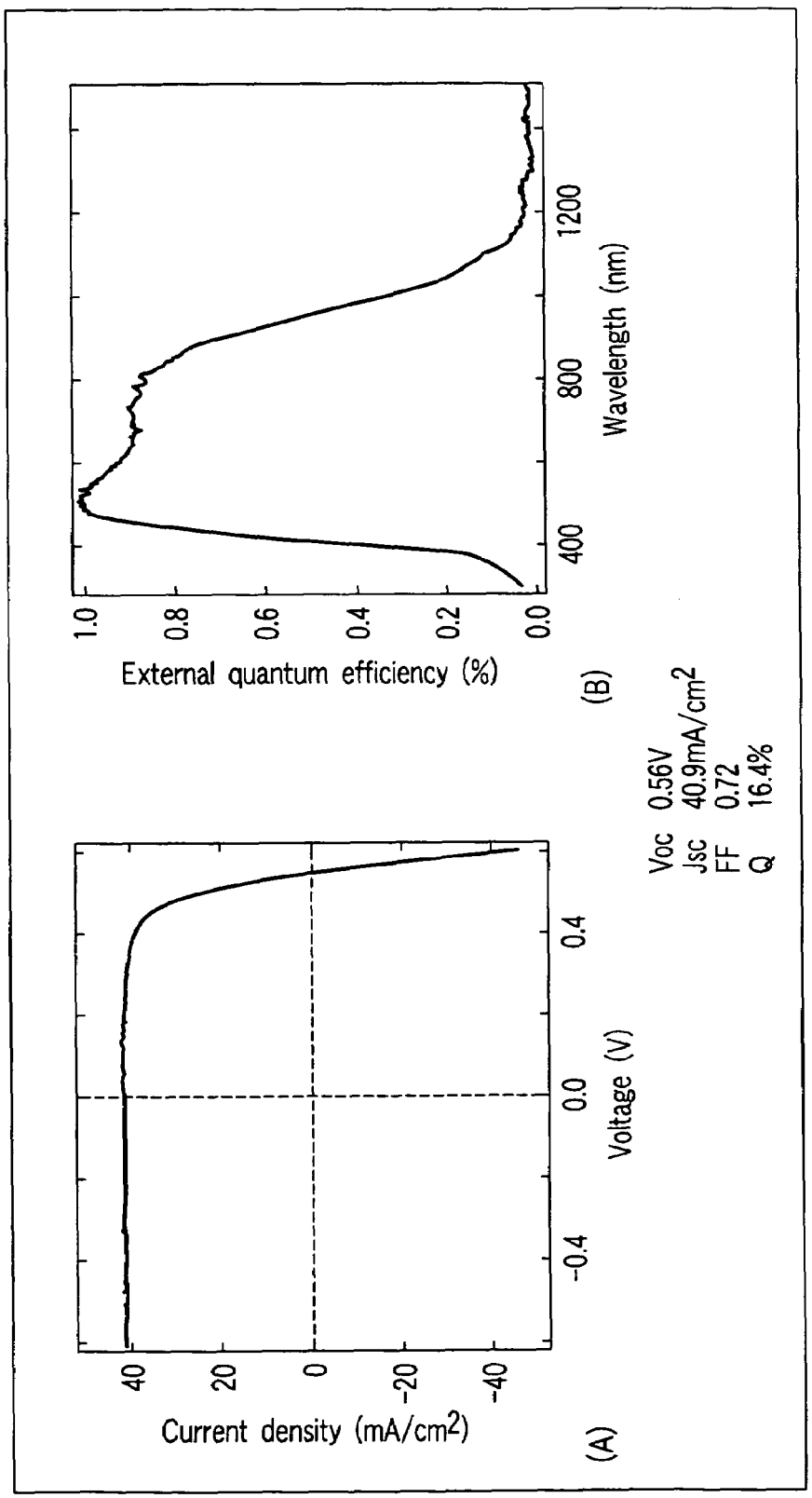
FIG. 6 is graphs (A) and (B) showing the performance of a solar cell using an SiGe bulk polycrystal of the present invention (an average Ge content: 5%)

As is apparent from the comparison between FIGS. 5 and 6, the SiGe bulk polycrystal according to the present invention shown in FIG. 6 can maintain a large short-circuit current density over a wide voltage range and also maintain a large external quantum efficiency over a wide wavelength range. Therefore, it is clear that a solar cell using the SiGe bulk polycrystal having a microscopic dispersion of Ge can has a higher conversion efficiency than that of a Si polycrystal. As is also apparent from Document 1 (P. Geiger et al.), the SiGe bulk polycrystal of the present invention can provide a high conversion efficiency that never been attained by a solar cell using a conventional SiGe polycrystal. There has been no report that shows even the possibility of manufacturing a solar cell having such a high conversion efficiency as in the present invention. This is because those skilled in the art believed that if Ge is contained in a Si polycrystal, the open current voltage greatly decreases. On the contrary to the conventional belief, the data shown in the present specification demonstrates that open current voltage does not decrease until the Ge content reaches about 5 atomic %.

Now, Examples of the present invention will be explained.

First, 1.66 g of Si and 3.71 g of Ge are mixed and melted to prepare a melt of a two-element SiGe system having a uniform composition. The melt is cooled at a predetermined cooling rate to obtain a polycrystal formed of crystal particles each having a crystallographic texture in which Ge-rich regions are dispersed in an Si-rich matrix (matrix).

FIGS. 7(A) to (D) are histograms showing the frequency distribution of the Si contents (shown in the horizontal axis), which is obtained by measuring a plurality of sampling points within the crystal surface for the content of Si. FIG. 7(A) to (D) show the cases where a melt is cooled at various cooling rates.

The cooling rates of (A) and (B) are 0.5° C./min and 10° C./min, respectively; (C) and (D) are the cases of air cooling and water cooling, respectively, each case of which an average content of Si is about 50%.

As is apparent from these graphs, when a melt is cooled at various cooling rates, crystals having microscopically different frequency distributions of Si content can be obtained. For example, a crystal is solidified to grow while it is cooled at a rate of 10° C./min, the obtained polycrystal having nearly equal distribution of Si contents can be obtained, as shown in FIG. 7(B). The polycrystals of FIGS. (A) to (D) have the structures shown in FIG. 8(A) to (D), respectively.

Figure 9:
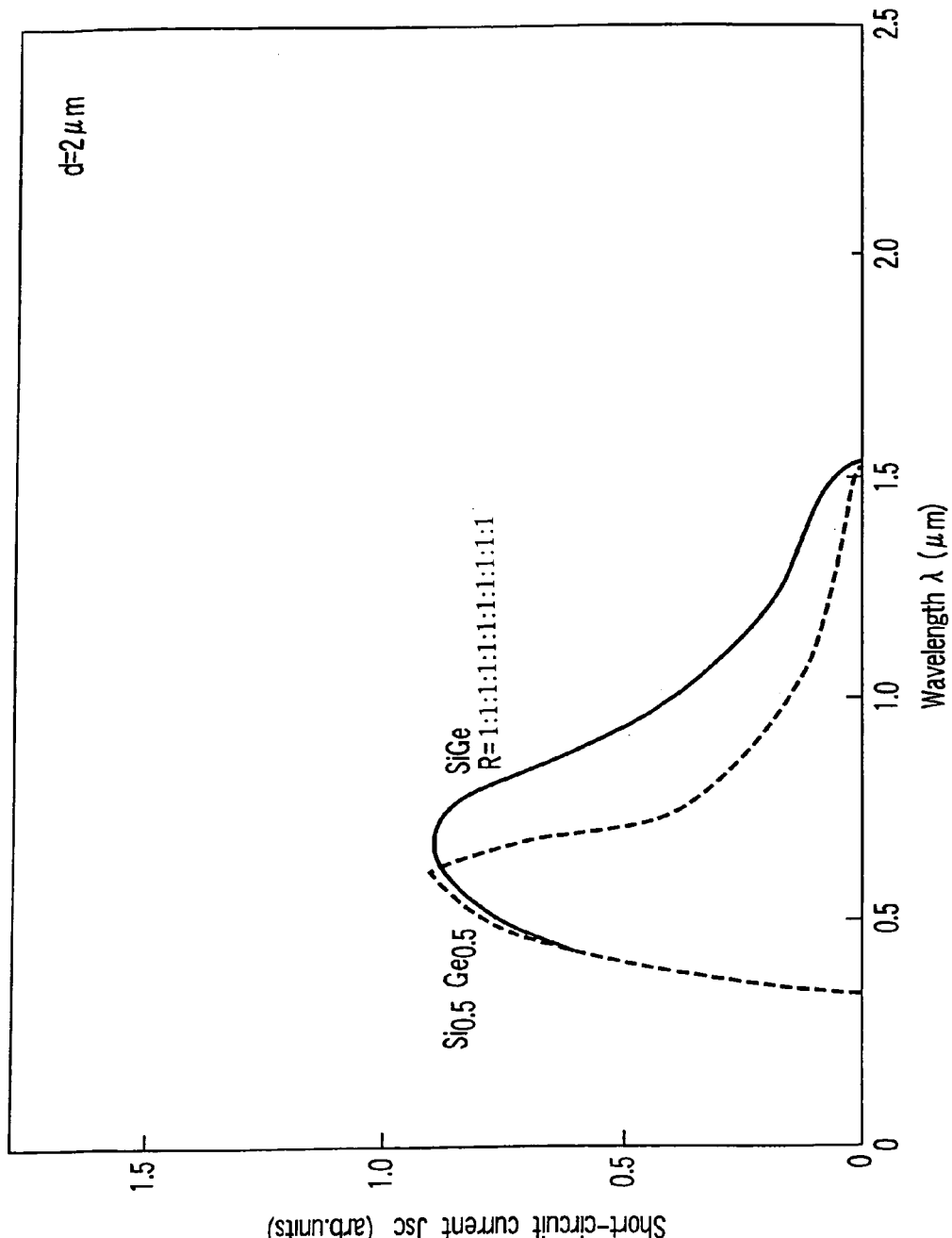
FIG. 9 is a graph showing the relationship between the short-circuit current of a solar cell and the wavelength of the absorbed light with respect to an SiGe polycrystalline solar cell of the present invention having a Si-content frequency distribution shown in (B) of FIG. 7 in comparison with an $Si_{0.5}Ge_{0.5}$ solar cell uniformly formed.

FIG. 9 is a graph showing the relationship between the short-circuit current of a solar cell and wavelength with respect to an SiGe polycrystalline solar cell of the present invention and a conventional $Si_{0.5}Ge_{0.5}$ solar cell. To obtain the data of FIG. 9, as a light source having a solar spectrum is used. In the figure, where the note "R=1:1:1:1:1:1:1:1:1:1:1" means that a crystal presumably has microscopic compositions represented by $Si_{1-x}Ge_x$ where X varies by 0.1 from 0 to 1; and the note "d=2 μm" means the carrier-diffusion distance required in calculation. The SiGe polycrystalline solar cell is formed in accordance with the present invention, that is, the cell has a crystallographic texture having Ge-rich regions scatted in an Si-rich matrix. The $Si_{0.5}Ge_{0.5}$ polycrystalline solar cell, which has a uniform composition, that is, a crystallographic texture having Ge-rich regions are not scatted in an Si-rich matrix, is manufactured by a conventional liquid-phase epitaxy method without controlling the cooling rate.

As is apparent from FIG. 9, the total area (light-trapping area) enclosed by the curve shown by the polycrystalline solar cell according to the present invention is wider than that shown by the conventional $Si_{0.5}Ge_{0.5}$ polycrystal solar cell, even though they have the same Si and Ge contents in average. This means that the solar cell of the present invention produces a larger amount of current, with the result that a light-conversion efficiency increases.

Figure 10:
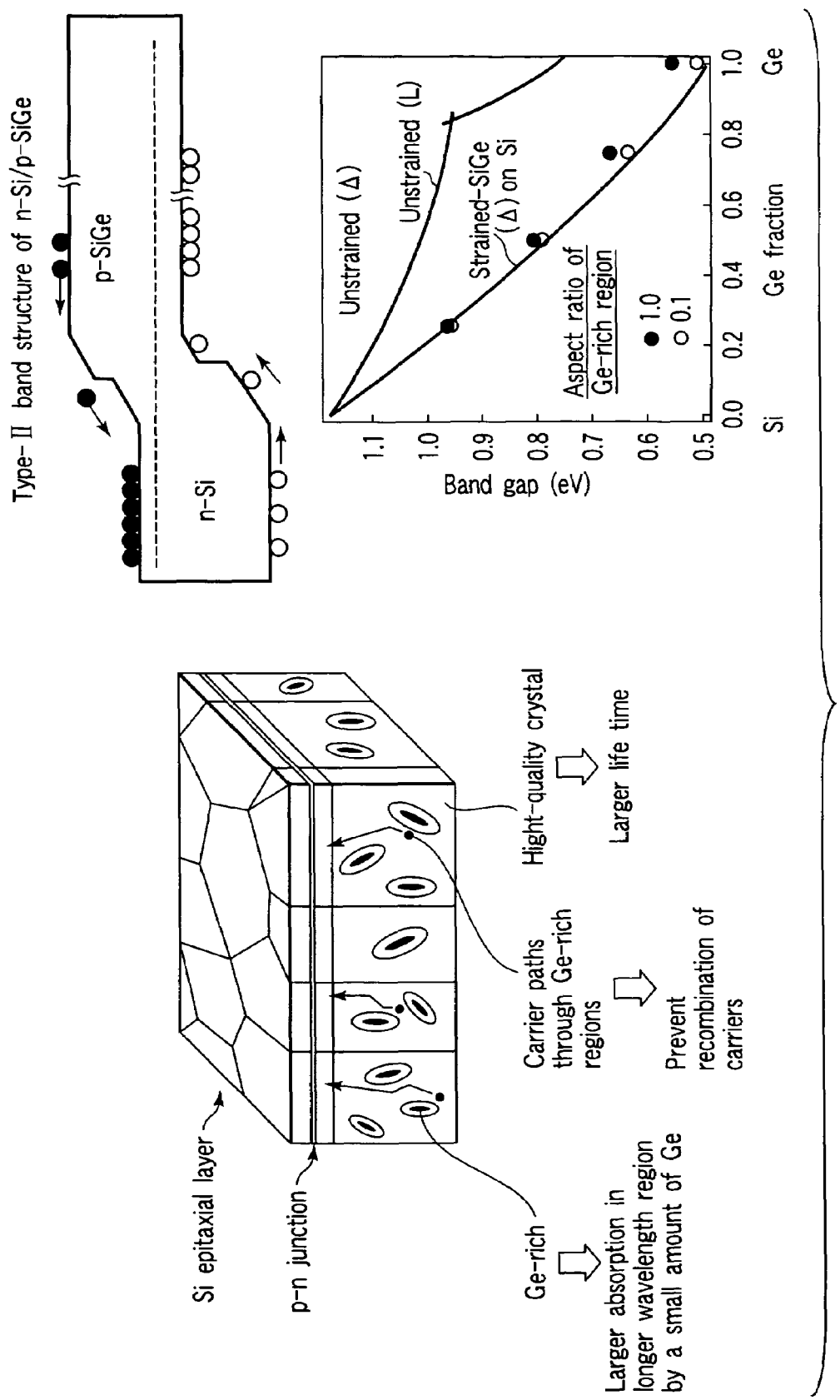
FIG. 10 shows a schematic diagram of an Si/SiGe heterostructure solar cell with a Si thin film epitaxially grown on a multi-element SiGe polycrystal.

In order to further increase the light-conversion efficiency, a thin film may be deposited on a substrate of SiGe polycrystal according to the present invention to form a two-layered structure (see FIG. 10). In the Examples, a SiGe polycrystal is explained. However, the light-conversion rate can be further improved if an InAs-GaAs system polycrystal is used. Other that this, a three-element system polycrystal formed of elements of the III-V group, such as GaSb—GaAs, and a four-element system polycrystal, such as InAs—GaP and InAs—GaSb, may be used. In short, any elements may be used in combination as long as materials have different absorption wavelengths.

As shown in FIG. 9, according to the present invention, it is possible to obtain a SiGe polycrystal solar cell capable of providing a short-circuit current by absorbing the wavelength corresponding to a solar light spectrum. The current thus obtained is larger than that obtained by a conventional Si polycrystal solar cell.

Furthermore, as is apparent from the characteristics of a solar cell shown in FIG. 4(B), open current voltage of the SiGe polycrystal solar cell of the present invention does not decrease until the Ge content reaches 5 atomic %. Because of this feature, the light conversion rate of the solar cell of the present invention becomes larger than a conventional solar cell, a shown in FIG. 4(B).

From FIG. 11, it is clear that the internal quantum efficiency the SiGe polycrystal solar cell of the present invention in the range of a long wavelength range is larger than that of a conventional Si polycrystal solar cell. As a result, the sensitivity of the solar cell to light in a long wavelength range can be increased.

Figure 7:
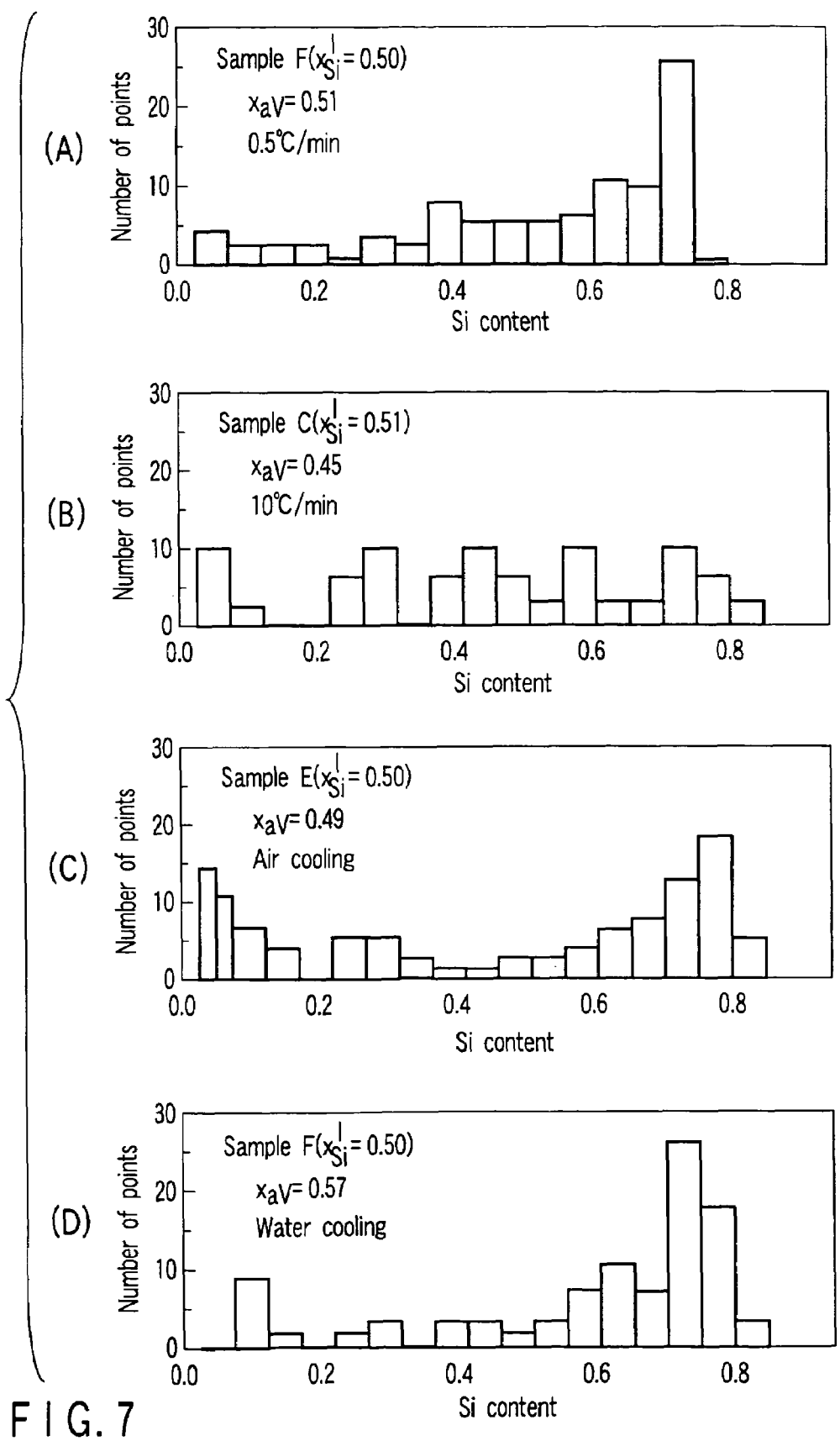
FIG. 7 is histograms (A) to (D) showing the frequency microscopic distribution of Si contents of a SiGe polycrystal grain when the polycrystal grain is formed by cooling at different cooling rates.
Figure 8:
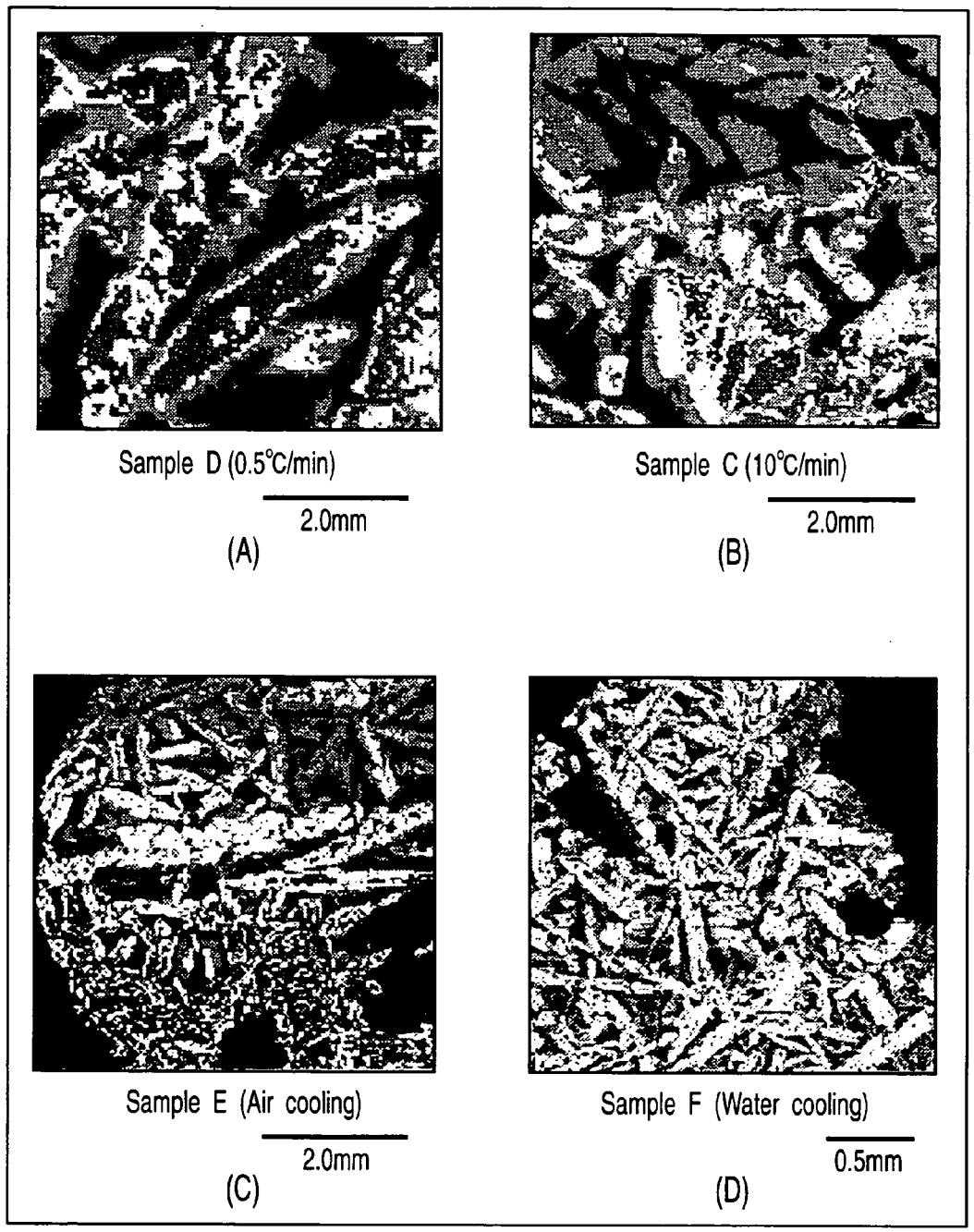
FIG. 8 is microphotographs (A) to (D) of SiGe polycrystals grown from a melting solution when the polycrystals are formed at cooling rates employed in (A), (B), (C) and (D) of FIG. 7, respectively.

Furthermore, according to the present invention, it is possible to control the sensitivity to the wavelength of the solar light as shown in FIG. 9 by regulating the Si content distribution by varying cooling conditions as shown in FIG. 7. As a result, it is possible to manufacture a solar cell having the most desirable distribution of components and thus absorbing the solar light with high efficiency.

What is claimed is:

1. A multi-element polycrystal, which is a mixed crystal essentially formed of elements A and B having different absorption wavelength ranges and having an average composition represented by $A_{1-x}B_x$, wherein
    the element B absorbs light over a longer range of wavelength from a shorter to longer wavelength range than the element A;
    each of the crystal grains of the mixed crystal has a crystallographic texture composed of a plurality of discrete regions dispersed in a matrix thereof; and
    the average composition of the matrix is represented by $A_{1-x1}B_{x1}$ and the average composition of the discrete regions is represented by $A_{1-x2}B_{x2}$ where X1<X<X2,
    wherein X satisfies the relationship $X \leq 0.1$.

2. The multi-element polycrystal according to claim 1, wherein said $A_{1-x}B_x$ is $Si_{1-x}Ge_x$.

3. The multi-element polycrystal according to claim 2, wherein the crystal grains each have a columnar shape, and the discrete regions are three-dimensionally dispersed in the matrix having strain.

4. The multi-element polycrystal according to claim 1, wherein said X satisfies the relationship: $X \leq 0.05$.

5. The multi-element polycrystal according to claim 1, which is incorporated in a solar cell.

6. A method of manufacturing a multi-element polycrystal, comprising the steps of:
    preparing a melt containing multiple elements; and
    cooling the melt while controlling a cooling rate and/or a composition of the melt to obtain a multi-element polycrystal, wherein
    the multi-element polycrystal includes polycrystalline grains each being formed of a crystallographic texture having discrete regions dispersed in a matrix,
    the melt has a composition for a mixed crystal represented by $A_{1-x}B_x$;
    the element B absorbs light over a longer range of wavelength from a shorter to longer wavelength range than the element A;
    each of the polycrystal grains manufactured has a crystallographic texture in which a plurality of discrete regions having an average composition represented by $A_{1-x2}B_{x2}$ are dispersed in a matrix thereof having an average composition represented by $A_{1-x}B_X$ where X1<X<X2, and
    X satisfies the relationship $X \leq 0.1$.

7. The method according to claim 6, wherein the element A is Si and the element B is Ge.

8. The method according to claim 6, wherein said X satisfies the relationship: $X \leq 0.05$.

9. A method of manufacturing a solar cell by using a multi-element polycrystal manufactured by the method according to claim 6, comprising:
    incorporating the multi-element polycrystal in the solar cell.

* * * * *